United States Patent [19]

Gibbs

[11] Patent Number: 5,446,745
[45] Date of Patent: Aug. 29, 1995

[54] APPARATUS FOR CORRECTING ERRORS IN OPTICAL DISKS

[75] Inventor: Vickie L. Gibbs, Durham, N.C.

[73] Assignee: Mitsubishi Semiconductor America, Inc., Durham, N.C.

[21] Appl. No.: 150,897

[22] Filed: Nov. 12, 1993

Related U.S. Application Data

[63] Continuation-in-part of Ser. No. 956,207, Oct. 5, 1992, abandoned.

[51] Int. Cl.6 ............................................. G06F 11/10
[52] U.S. Cl. ................................. 371/37.7; 364/746.1
[58] Field of Search ................... 364/746.1; 371/37.1, 371/37.7

[56] References Cited

U.S. PATENT DOCUMENTS

| | | |
|---|---|---|
| 4,162,480 | 7/1979 | Berlekamp . |
| 4,847,801 | 7/1989 | Tong ................................. 364/746.1 |
| 4,852,098 | 7/1989 | Brechard et al. . |
| 4,866,654 | 9/1989 | Yamada ............................... 371/37.1 |
| 4,875,211 | 10/1989 | Mural et al. . |
| 4,918,638 | 4/1990 | Matsumoto et al. ............. 364/746.1 |
| 5,046,037 | 9/1991 | Cognault et al. ................. 364/746.1 |
| 5,068,857 | 11/1991 | Yoshida ............................... 371/37.7 |
| 5,136,592 | 8/1992 | Weng ................................. 364/746.1 |

*Primary Examiner*—Paul P. Gordon
*Assistant Examiner*—Steven R. Garland
*Attorney, Agent, or Firm*—Lowe, Price, Leblanc & Becker

[57] ABSTRACT

For error correction circuitry capable of correcting a maximum of 8 bytes for every 120 byte code word in an optical disk storage, a shortened Reed-Solomon (120,104) code over the Galois field $GF(2^8)$ is used. Cyclic Redundancy Check (CRC) and Reed-Solomon (RS) encoders generate CRC and RS code words to be supplied to the optical disk storage. A syndrome generator receives the RS code words unloaded from the storage and detects errors in unloaded data. A CRC decoder receives the CRC code words unloaded from the storage and checks parity errors. For coding and decoding, the components of the error correction circuitry utilize unary multipliers having a plurality of XOR gates for multiplying by a Galois field element $\alpha^i$. In order to provide fewer signal paths in the unary multipliers, the Galois field is generated using the primitive element $\beta^{106}$ for poly 15, the primitive element $\beta^{127}$ for poly 6 and the primitive element $\beta^{128}$ for poly 5.

28 Claims, 12 Drawing Sheets

UMULT135 POLY_5
BETA_128

UMULT135 POLY_6
BETA_127

UMULT40 POLY_5
BETA_128

UMULT40 POLY_15 BETA_106

UMULT40 POLY_15
BETA_88

APPARATUS FOR CORRECTING ERRORS IN OPTICAL DISKS

CROSS REFERENCE TO RELATED APPLICATION

This application is a continuation-in-part of application Ser. No. 07/956,207, filed Oct. 5, 1992, now abandoned.

TECHNICAL FIELD

This invention relates generally to error control, and more particularly, to apparatus for correcting errors that occur during data storage.

BACKGROUND ART

Since a storage medium is subject to various types of noise, distortion and interference, various errors can occur at the output of the storage medium. The massive amount of digital data stored in an optical disk storage increases the probability of the errors. To correct the errors, error control coding is used. Reference is now made to FIG. 1, wherein an error correction system comprises an encoding section 21, which transforms an input information sequence entered on the optical disk storage into code words.

In optical disk applications the code words are encoded based on International Standard Organization (ISO) Standard that requires Cyclic Redundancy Check (CRC) encoding and incorporates a Reed-Solomon (RS) code over some Galois fields.

The RS (m,k) code is a cyclic symbol error-correcting code where k symbols of an original data are encoded. The result, which is an (m-k)-symbol redundancy block, is appended to the data.

The Galois field is a finite field, the elements of which may be represented as polynomials in a particular primitive element. The RS code represents a block sequence of a Galois field $GF(2^n)$ of $2^n$ binary symbols, where n is the number of bits per symbol. Constructing the Galois field $GF(2^n)$ requires a generator polynomial p(x) of degree n and a primitive element $\beta$, which is a root of p(x). The powers of B generate all nonzero elements of $GF(2^n)$. Encoding and decoding circuitry is therefore required which has a capability of performing Galois field arithmetic.

The encoding section 21 comprises a CRC encoder 22 for CRC encoding input data entered on the optical disk and a RS encoder 23 for RS encoding the input data. According to the ISO requirement, the CRC encoder 22 generates four CRC redundancy bytes. The RS encoder 23 generates, in k steps, (m-k) redundancy bytes, which are appended to the original code data to make a m-byte code word. A writing unit 24 records the coded data on an optical disk 25.

A reading unit 26 unloads data from the optical disk 25 and transfers them to a decoding section 27. The decoding section 27 comprises a syndrome generator 28 for decoding the RS code and a CRC decoder 29 for checking the CRC redundancy bytes. The syndrome generator 28 calculates the syndrome for each word received from the optical disk. The syndrome is the (m-k)-bit vector, which is actually the remainder that results from dividing an error polynomial by the original generator polynomial. Therefore, the syndrome helps to locate errors and calculate error values.

The CRC decoder 29 provides the redundancy check corresponding to the CRC encoding. Due to the operational similarity in the CRC encoding and decoding, the CRC encoder 22 and CRC decoder 29 usually share the same circuitry.

For error correction, circuitry capable of correcting a maximum of 8 bytes for every 120 byte code word, used in an optical disk storage, a shortened RS (120,104) code over the Galois field $GF(2^8)$ is required. This field consists of 256 vectors which represent every number between and including 0 to 255. These vectors are referenced using a specific element $\alpha^i$, where i=0, 1, ..., 255.

In order to generate $GF(2^8)$, a generator polynomial p(x) of degree 8 (e.g. $p(x)=1+x^2+x^3+x^5+x^8$) and a primitive element $\beta^j$ are required. The primitive element $\beta^j$ can be used to generate another field by the same polynomial. The j represents a number coprime to $(2^n-1)$ for $GF(2^n)$, i.e. a number which is not divisible by $(2^n-1)$ or any of its factors. For $GF(2^8)$, there are 128 different primitive elements $\beta^j$, which can be used to generate various fields from each particular generator polynomial.

To implement their functions, each of the above indicated encoding and decoding elements requires a plurality of unary multipliers for multiplying by field elements in a Galois field. Each of the multipliers corresponds to the specific field element $\alpha^i$. Each unary multiplier consists of a plurality of Exclusive-OR (XOR) gates. The number of the XOR gates is a determining factor for the total signal delay of the error correction circuit. Reduction of the signal delay would allow to increase the processing speed of the error correction circuit.

In view of the above, it would be desirable to provide a system for correcting errors in optical disks, wherein the fewest number of the XOR gates could be used.

DISCLOSURE OF THE INVENTION

Accordingly, one advantage of the invention is in increasing the processing speed of a system for correcting errors in optical disks.

Another advantage of the invention is in correcting errors in optical disks with the fewest number of signal paths in encoding and decoding circuitry.

The above and other advantages of the invention are satisfied, at least in part, by providing a logic circuit for processing elements of a Galois field, generated using a generator polynomial and a primitive element $\beta^j$, with XOR gates, the number of which corresponds to a predetermined primitive element $\beta^j$.

In accordance with a preferred embodiment of the invention the CRC encoder/decoder, RS encoder, and/or syndrome generator comprise a plurality of Galois field logic circuits for processing elements $\alpha^i$ of the Galois field $GF(2^8)$, generated using a generator polynomial p(x) and a primitive element $\beta^j$. Each of the logic circuits comprises a number of XOR gates corresponding to a predetermined primitive element $\beta^j$.

The polynomials p(x) used to encode in the CRC and RS encoders are expanded using the ISO standard. The coefficients of these polynomials are the unary multipliers used to implement the function. For CRC the expansion $$\sum_{i=136}^{139} (x+\alpha^i) \quad (1)$$

is used to obtain the polynomial to be used to implement the function. For RS, the expansion $$\sum_{i=120}^{135}(x+\alpha^i) \quad (2)$$

is used to obtain its polynomial. Since the $\alpha^i$ multiplication and addition varies according to the field used, each field may have a different polynomial expansion.

In accordance with one aspect of the invention, the Galois field logic circuit may perform unary multiplication by the element $\alpha^i$. The CRC encoder/decoder may comprise the unary multipliers for elements $\alpha^{10}$, $\alpha^{40}$, $\alpha^{217}$, and $\alpha^{237}$. The RS encoder may include the unary multipliers for elements $\alpha^{15}$, $\alpha^{70}$, $\alpha^{87}$, $\alpha^{135}$, $\alpha^{138}$, $\alpha^{154}$, $\alpha^{166}$ and $\alpha^{241}$. The syndrome generator includes the unary multipliers for elements $\alpha^{120}$–$\alpha^{135}$.

In accordance with another aspect, the number of XOR gates in each unary multiplier corresponds to $\beta^{106}$, $\beta^{127}$ or $\beta^{128}$.

In accordance with a further aspect of the invention, the Galois field GF($2^8$) is generated using the generator polynomial $p1(x)=1+x^2+x^3+x^5+x^8$, $p2(x)=1+x^2+x^3+x^7+x^8$, or $p3(x)=1+x+x^5+x^6+x^8$ for $\beta^{106}$, $\beta^{127}$ and $\beta^{128}$ respectively.

Still other advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 11A-H and 12A-H show typical unary multipliers for $\alpha^i$ in the field created by the primitive element $\beta^{88}$.

BEST MODE FOR PRACTICING THE INVENTION

The best mode for practicing the invention is based on the realization that for error correction circuitry capable of correcting a maximum of 8 bytes for every 120 byte code word, used in an optical disk storage, a shortened Reed-Solomon RS (120,104) code over the Galois field GF($2^8$) is required. The generator polynomials poly $15=p1(x)=x^8+x^5+x^3+x^2+1$,
poly $6=p2(x)=x^8+x^7+x^3+x^2+1$, or
poly $5=p3(x)=x^8+x^6+x^5+x+1$ are used.

Figure 1:
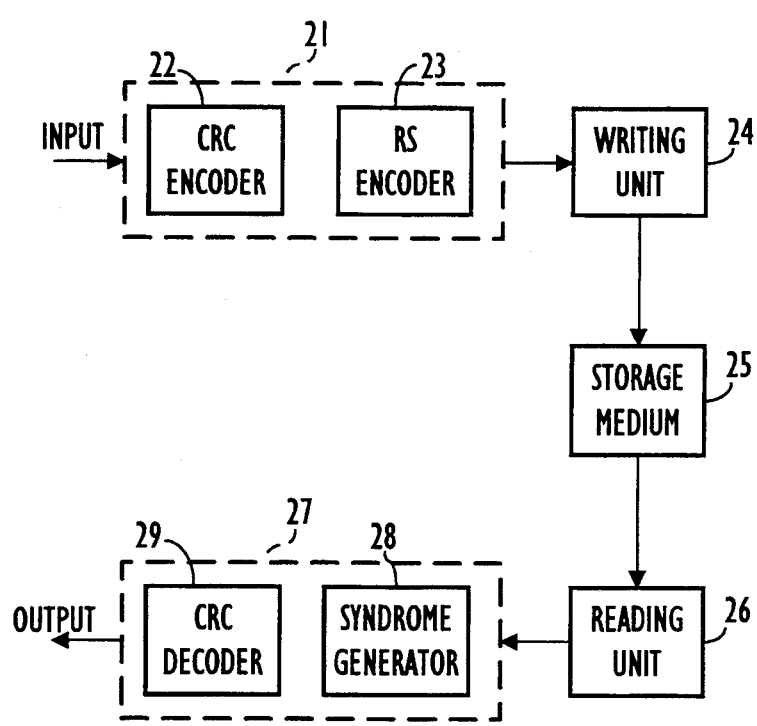
FIG. 1 is a block diagram of a prior art system for correcting errors in an optical disk storage.

As indicated above in connection with FIG. 1, a conventional correction system comprises encoding and decoding sections for Cyclic Redundancy Check (CRC) and RS encoding and decoding.

Figure 2:
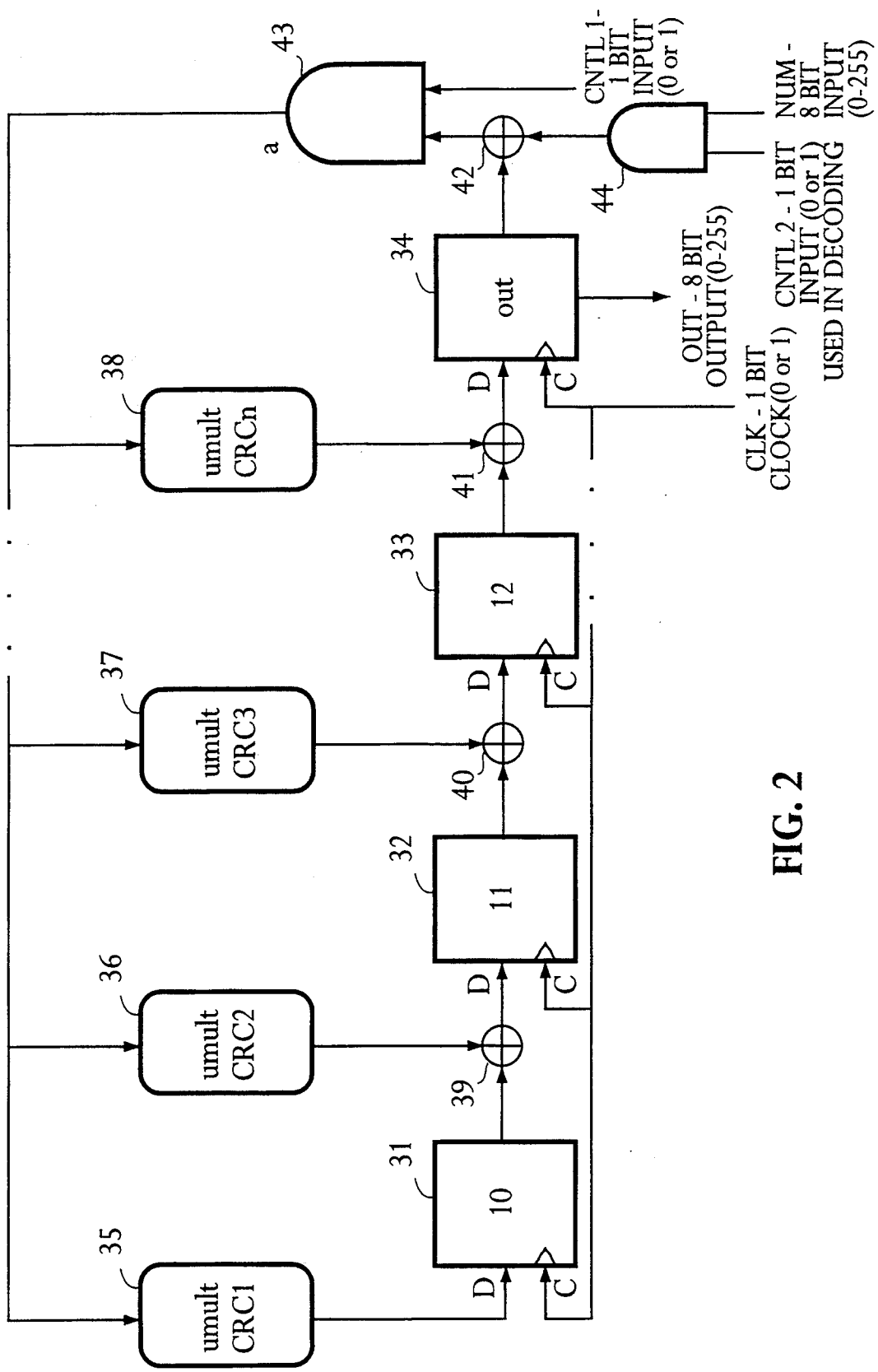
FIG. 2 is a diagram showing a Cyclic Redundancy Code encoder/decoder of a system for correcting errors according to the preferred embodiment of the present invention.

Reference is now made to FIG. 2 of the drawings showing a CRC module for CRC encoding data entered on the optical disk and CRC decoding code words unloaded from the optical disk. The CRC module comprises a set of flip-flops 31–34 operating as a linear feedback shift register (LFSR). 8-bit data inputs D of the flip-flops are connected to 8-bit unary multipliers 35–38 for unary multiplication by the Galois field elements $\alpha^{CRC1}$, $\alpha^{CRC2}$, . . . , $\alpha^{CRCn}$. For the poly 15, $\beta^{88}$, $\alpha^{40}$, $\alpha^{117}$, $\alpha^{228}$ and $\alpha^{97}$ are used. For the poly 15, $\beta^{106}$, poly 6, $\beta^{127}$ and poly 5, $\beta^{128}$, $\alpha^{40}$, $\alpha^{237}$, $\alpha^{10}$ and $\alpha^{217}$ are used. The unary multipliers 36–38 are respectively connected to the data inputs of the flip-flops 32–34 through Exclusive-OR (XOR) gates 39–41. An XOR gate 42 creates a feedback for connecting the output of the shift register to the corresponding data inputs. The output of the XOR gate 42 is connected to an input of an AND gate 43, a second input of which is connected to a 1-bit control input of the CRC module. 8-bit input data are entered the CRC module through an AND gate 44, a second input of which is used in decoding procedure. 1-bit clock inputs C of the flip-flops 31–34 are supplied with a clock signal generated by an external circuit (not shown). According to the ISO standard for the RS (120, 104) code, the CRC module generates, in 104 steps, four redundancy bytes, which are accumulated for each of the 104 input data bytes until all the input data pass through the LFSR during the encoding procedure. During the decoding procedure, the corrected code words are checked by sequentially reading them.

Figure 3:
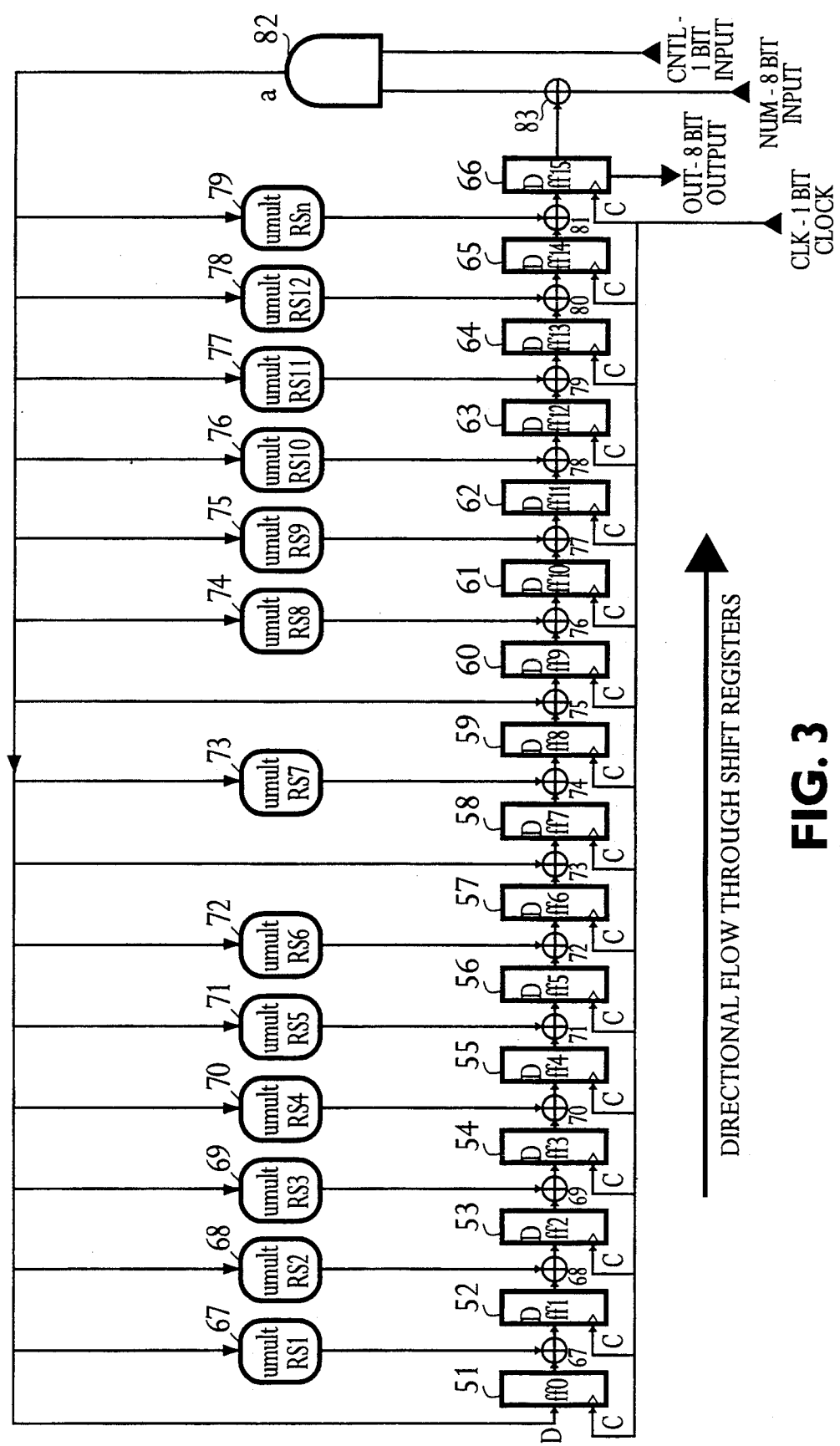
FIG. 3 is a diagram showing a Reed-Solomon encoder of the system for correcting errors according to the preferred embodiment of the present invention.

As shown in FIG. 3, the RS encoder comprises a set of sixteen flip-flops 51–66 representing a LFSR. Each of the flip-flops 51–66 has an 8-bit data input D, a 1-bit clock input C and an 8-bit output. Feedback loops of the LFSR comprise unary multipliers 67–79 for respectively multiplying a feedback signal by the Galois field elements $\alpha^{RS1}$, $\alpha^{RS2}$, . . . , $\alpha^{RSn}$. For poly 15, $\beta^{88}$, $\alpha^{180}$, $\alpha^{20}$, $\alpha^{42}$, $\alpha^{16}\alpha^{179}$, $\alpha^{142}$, $\alpha^{11}$, $\alpha^{142}$, $\alpha^{179}$, $\alpha^{16}$, $\alpha^{42}$, $\alpha^{20}$ and $\alpha^{180}$ are used. For poly 15, $\beta^{106}$, poly 6, $\beta^{127}$ and poly 5, $\beta^{128}$, $\alpha^{15}$, $\alpha^{166}$, $\alpha^{70}$, $\alpha^{135}$, $\alpha^{135}$, $\alpha^{138}$, $\alpha^{154}$, $\alpha^{241}$, $\alpha^{87}$, $\alpha^{241}$, $\alpha^{154}$, $\alpha^{138}\alpha^{135}$, $\alpha^{70}$, $\alpha^{166}$ and $\alpha^{15}$ are used. Unary multipliers 67–72 are respectively connected to the data inputs of the flip-flops 52–57 through XOR gates 67–72. Unary multiplier 73 is connected through XOR gate 74 to the data input of the flip-flop 59. The unary multipliers 74–79 are respectively connected to the data inputs of the flip-flops 61–66 through XOR gates 76–81. The data inputs of the flip-flops 51, 58 and 60 are supplied with a feedback signal. Second inputs of the XOR gates 67–81 receive the outputs of the corresponding flip-flops. The feedback signal is generated by an AND gate 82, the first input of which is connected through an XOR gate 83 to the output of the LFSR. 8-bit input data are supplied to the RS encoder through the second input of the XOR gate 83. The second input of the AND gate 82 is supplied with a 1-bit control signal. The clock inputs C of the flip-flops 51–66 are connected to an external clock circuit (not shown). The RS encoder generates a 16-byte redundancy block, which is generated in 104 steps and appended to the 104-byte input data to make a 120-byte RS code word to be written on the optical disk.

Figure 4:
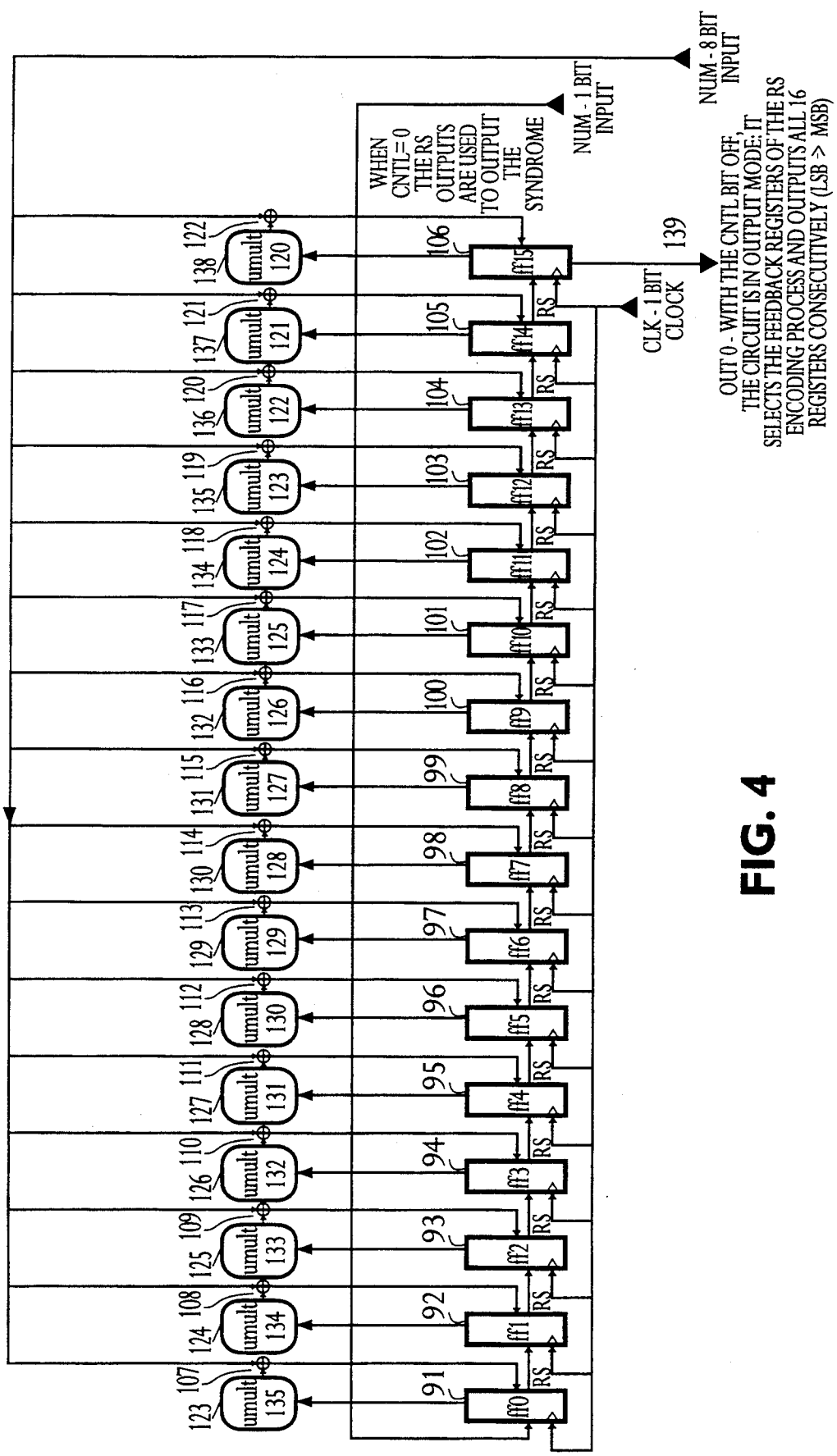
FIG. 4 is a diagram showing a syndrome generator of the system for correcting errors according to the preferred embodiment of the present invention.
Figure 5A:
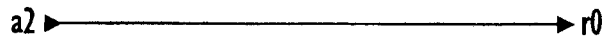
FIGS. 5A-H to 10A-H show typical unary multipliers for multiplying by a Galois field element $\alpha^i$ in the field created by the primitive elements $\beta^{128}$, $\beta^{127}$ and $\beta^{106}$ according to the preferred embodiments of the present invention.
Figure 5B:
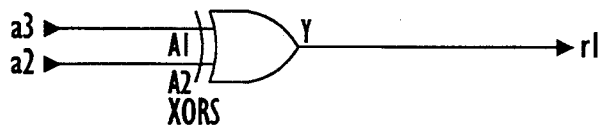
Figure 5C:
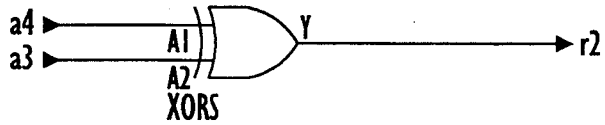
Figure 5D:
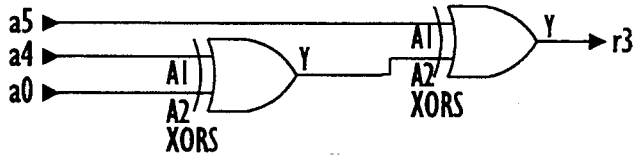
Figure 5E:
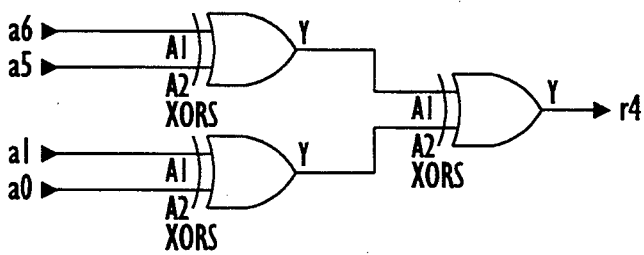
Figure 5F:
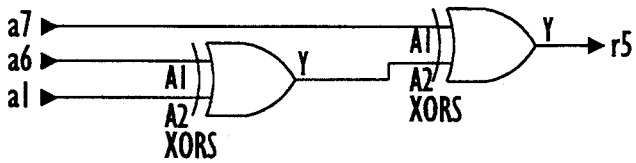
Figure 5G:
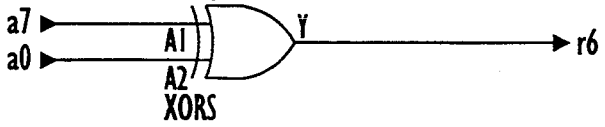
Figure 5H:
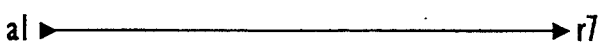

Reference is now made to FIG. 4 showing the syndrome generator for decoding the RS code word unloaded from the optical disk. The syndrome generator comprises a LFSR, which includes sixteen flip-flops 91-106. Each of the flip-flops has an 8-bit data input D, a 1-bit control input RS, a 1-bit clock input C and an 8-bit output. The 8-bit input signal applied to the syndrome generator is respectively applied to the data inputs of the flip-flops 91-106 through XOR gates 107-122. The second inputs of the XOR gates 107-122 receive the output signals of unary multipliers 123-138, respectively. For poly 15, poly 6 and poly 5, the unary multipliers 123-138 multiply the output signals of the flip-flops 91-106 by the Galois field elements $\alpha^{135}$-$\alpha^{120}$, respectively. The clock inputs of the flip-flops 91-106 are supplied with the clock signal generated by the external clock circuit (not shown). The control inputs of the flip-flops 91-106 are activated under control of an external 1-bit control signal (when the control signal is represented by binary zero) for consecutively outputting all the flip-flops 91-106 in order to generate the syndrome bytes at the output 139 of the syndrome generator. It requires 120 steps to generate the syndrome bytes, which serve to detect errors.

As shown in FIGS. 2-4, the encoding and decoding circuitry of the error correcting system includes a plurality of unary multipliers for multiplying a 8-bit number a[0:7] by the Galois field elements $\alpha^i$.

As indicated above, in order to generate the Galois field $GF(2^8)$, a generator polynomial p(x) of degree 8 and a primitive element $\beta^j$ are required. The primitive element $\beta^j$ can be used to generate another field by the same polynomial. The j represents a number coprime to $(2^n-1)$ for $GF(2^n)$, i.e. a number which is not divisible by $(2^n-1)$ or any of its factors. For $GF(2^8)$ there are 128 different primitive elements $\beta^j$, which can be used to generate various fields from each particular generator polynomial.

According to the preferred embodiments of the present invention, the following primitive elements are used for generating the Galois field $GF(2^8)$:
for poly 15, $\beta^{106}$,
for poly 6, $\beta^{127}$, and
for poly 5, $\beta^{128}$.

Reference is now made to FIGS. 5-10 of the drawings showing typical unary multipliers $\alpha^i$ of the encoding and decoding circuitry. The inputs a[0]- a[7] of the unary multiplier $\alpha^i$ represent corresponding bits of the 8-bit input number a[0:7]. The 8-bit output number r[0:7], which is equal to the product of the number a[0:7] by $\alpha^i$, is formed at the outputs r[0]- r[7] of the unary multiplier. To provide the multiplication, a plurality of XOR gates is coupled between the inputs a[0:7] and the outputs r[0:7].

FIGS. 5, 6, and 7 show the unary multipliers for multiplying by a Galois field element $\alpha^{135}$ in the field created by the primitive elements $\beta^{128}$ (poly 5), $\beta^{127}$ (poly 6) and $\beta^{106}$ (poly 15), respectively, according to the preferred embodiments of the present invention. These unary multipliers are used, for example, in the syndrome generator shown in FIG. 4. For example, FIGS. 5A-5H represent the corresponding outputs r[0:7] of the unary multiplier for $\alpha^{135}$ in the Galois field created by the primitive element $\beta^{128}$. As shown in FIG. 5A, the output r[0] of this multiplier is provided directly by the input a[0]. The output r[1] shown in FIG. 5B is connected to the output of an XOR having its inputs connected to the inputs a[2] and a[3]. As shown in FIG. 5C, the output r[2] is formed by an output of an XOR gate having its inputs connected to the inputs a[3] and a[4]. The output r[3] shown in FIG. 5D is provided by an output of an XOR gate having its inputs connected to the input a[5] and to the output of another XOR gate coupled to the inputs a[0] and a[4]. The output r[4] represented in FIG. 5E is provided by an XOR gate connected to the outputs of two XOR gates having their inputs coupled to the inputs a[0], a[1] and a[5], a[6]. As shown in FIG. 5F, the output r[5] is provided by an output of an XOR gate having its inputs connected to the input a[7] and the output of another XOR gate having its inputs coupled to the inputs a[1] and a[6]. The output r[6] in FIG. 5G is connected to the output of an XOR gate coupled to the inputs a[0] and a[7]. The output r[7] respectively shown in FIG. 5H is provided directly by the input a[1]. Thus, to implement the unary multiplier for $\alpha^{135}$ in the Galois field created by the primitive element $\beta^{128}$ with poly 5, ten XOR gates are required.

Figure 6A:
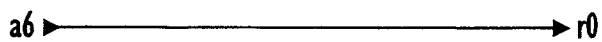
Figure 6B:
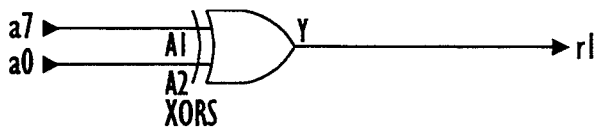
Figure 6C:
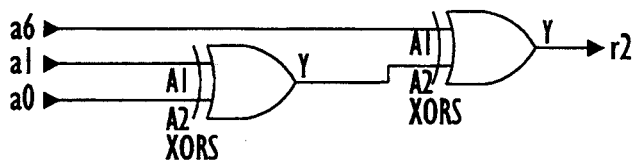
Figure 6D:
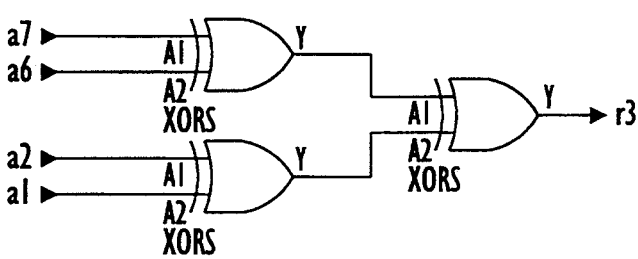
Figure 6E:
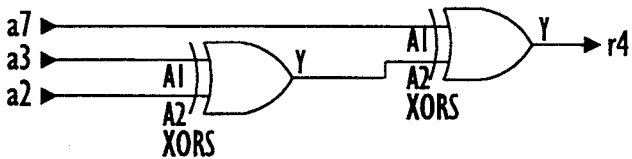
Figure 6F:
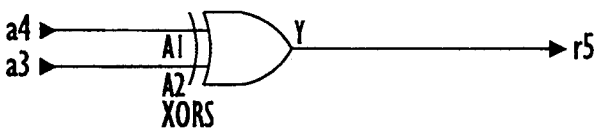
Figure 6G:
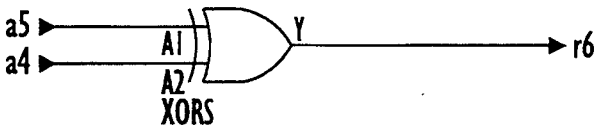
Figure 6H:
Figure 7A:
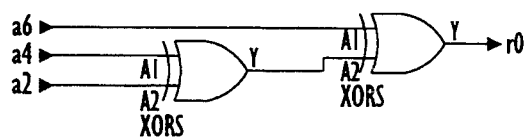
Figure 7B:
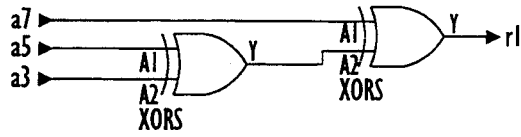
Figure 7C:
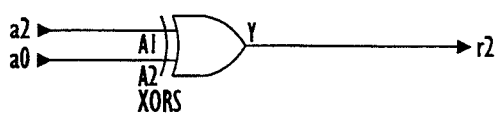
Figure 7D:
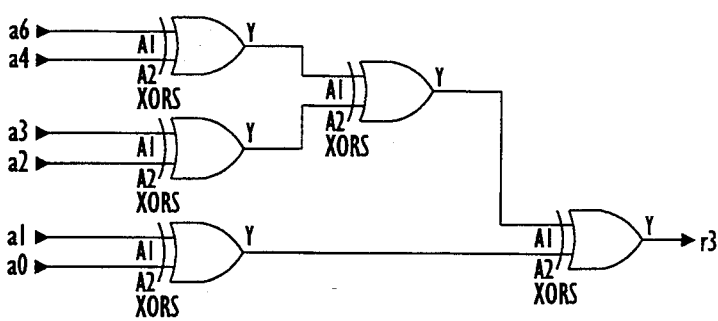
Figure 7E:
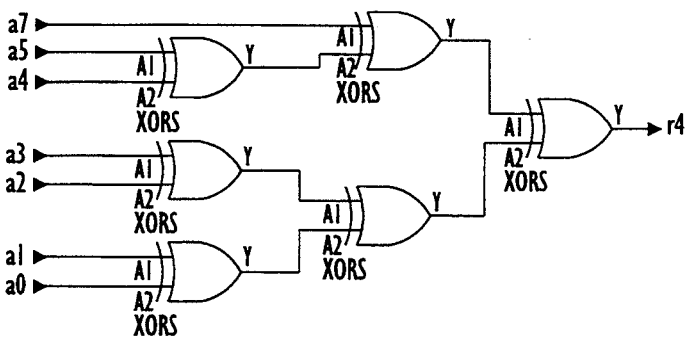
Figure 7F:
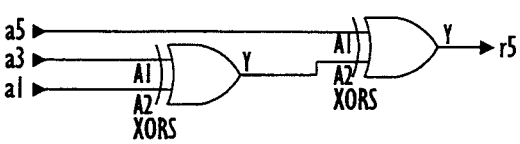
Figure 7G:
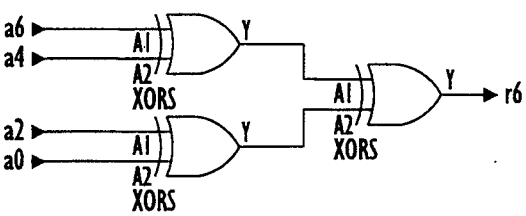
Figure 7H:
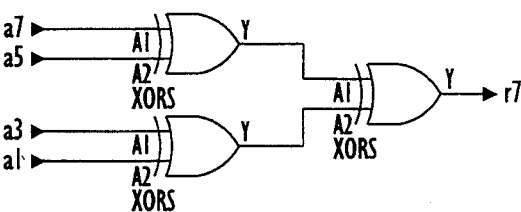
Figure 8A:
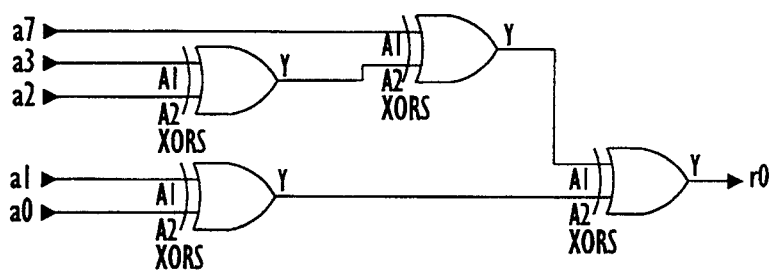
Figure 8B:
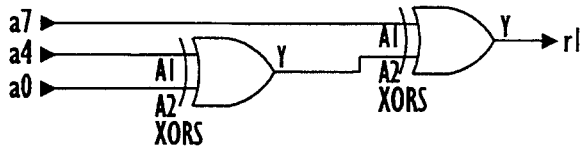
Figure 8C:
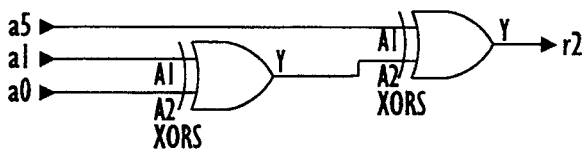
Figure 8D:
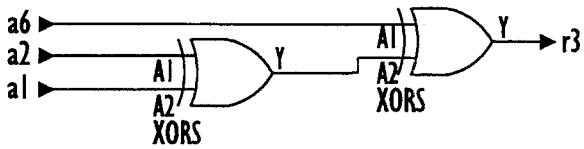
Figure 8E:
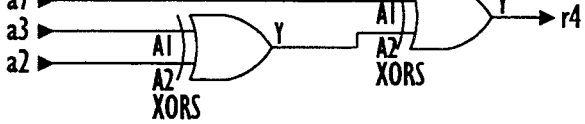
Figure 8F:
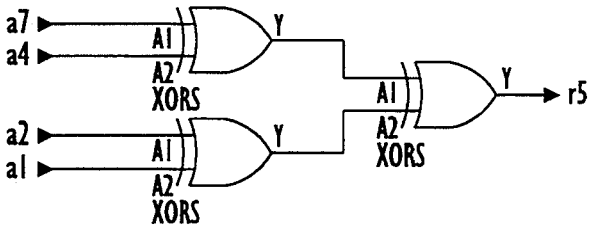
Figure 8G:
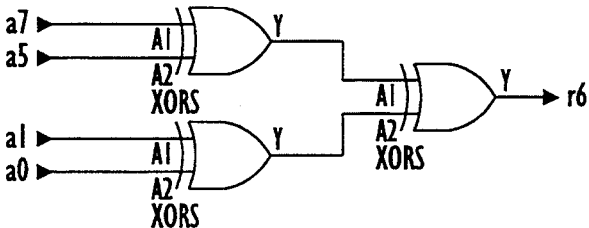
Figure 8H:
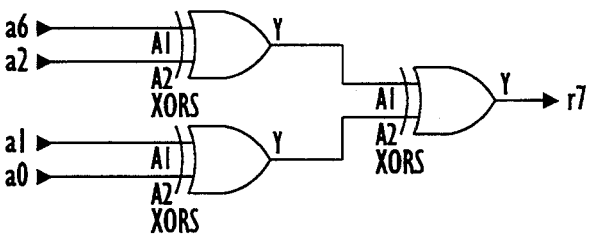
Figure 9A:
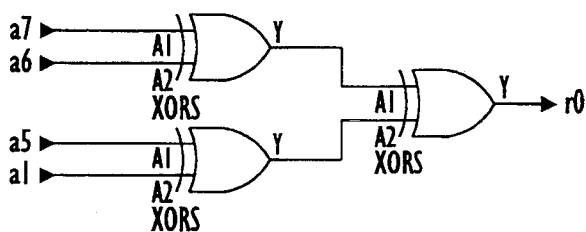
Figure 9C:
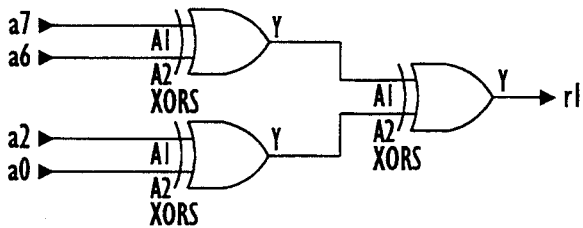
Figure 9D:
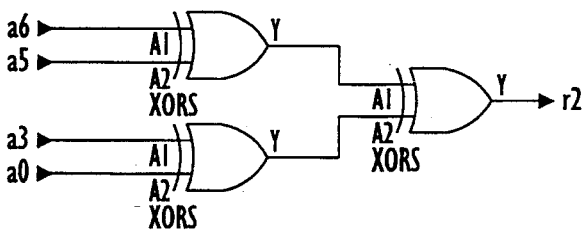
Figure 9E:
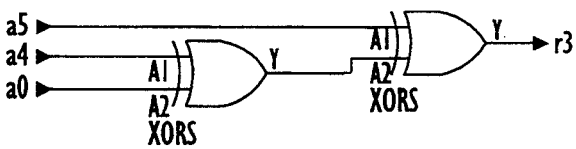
Figure 9F:
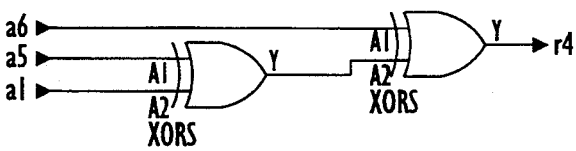
Figure 9G:
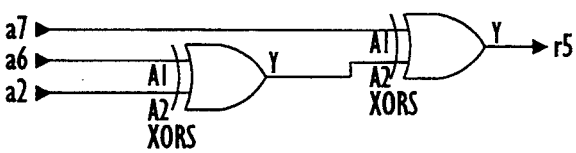
Figure 9H:
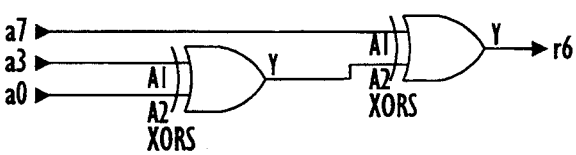
Figure 9B:
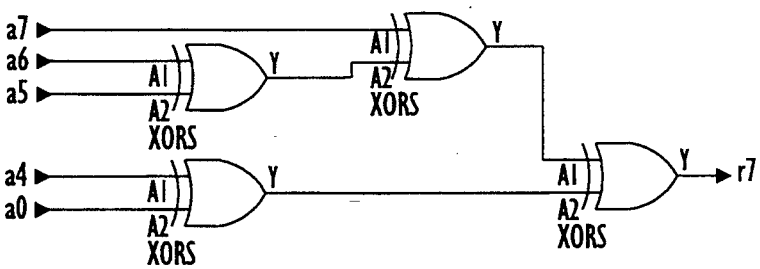
Figure 10A:
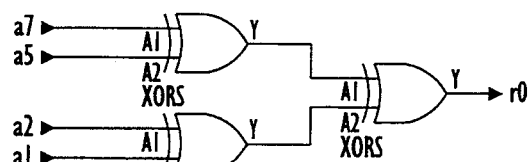
Figure 10B:
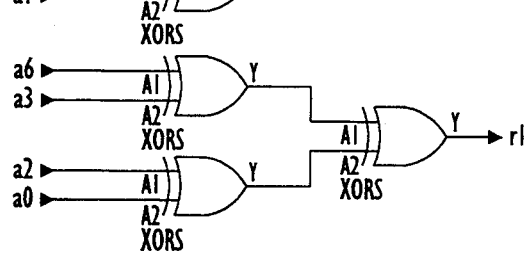
Figure 10C:
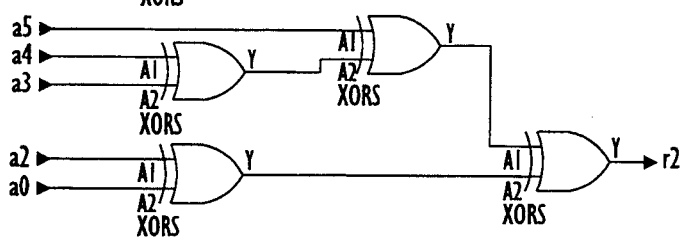
Figure 10D:
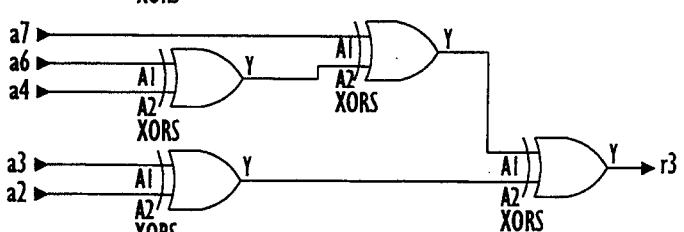
Figure 10E:
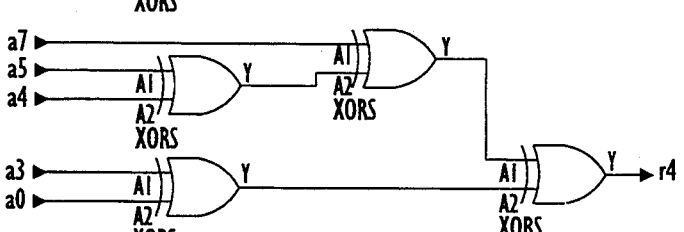
Figure 10F:
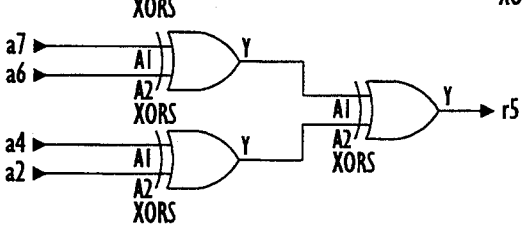
Figure 10G:
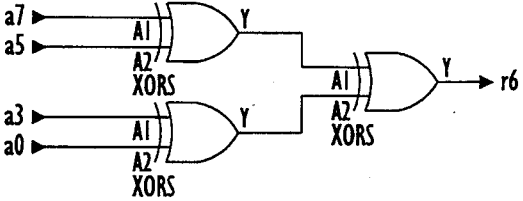
Figure 10H:
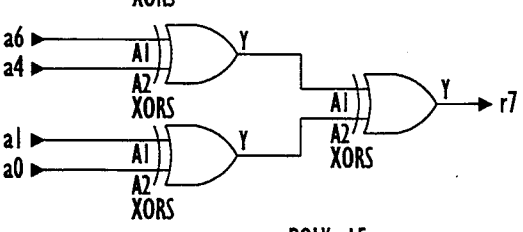
Figure 12A:
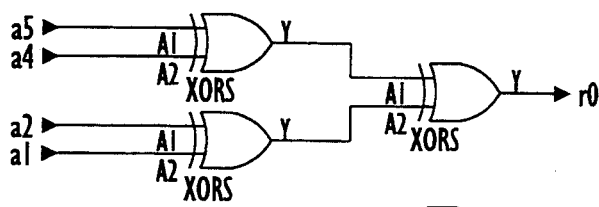
Figure 12B:
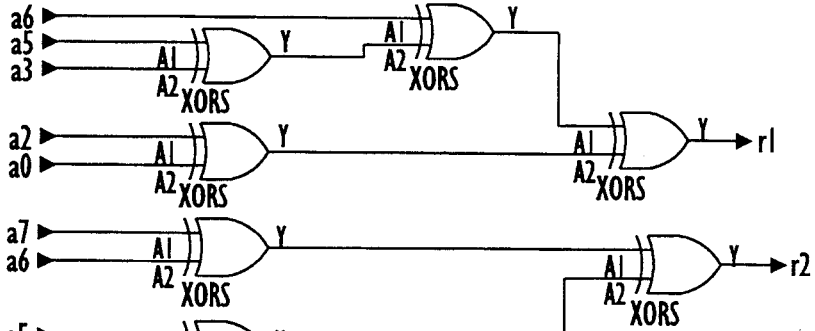
Figure 12C:
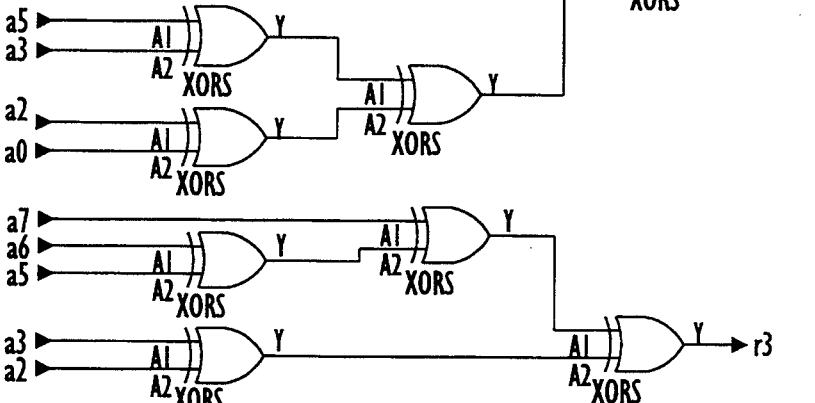
Figure 12D:
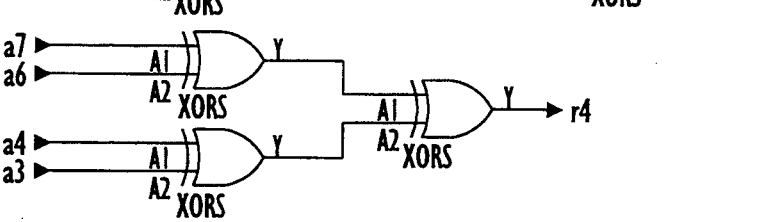
Figure 12E:
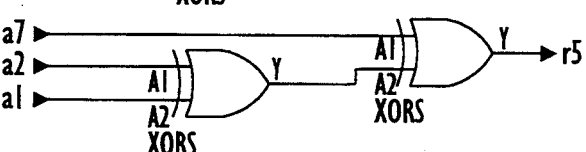
Figure 12F:
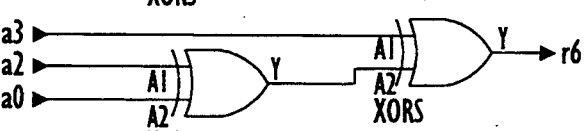
Figure 12G:
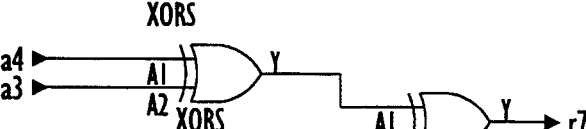
Figure 12H:
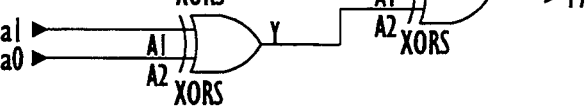

FIGS. 6A-6H respectively represent the outputs r[0:7] of the unary multiplier for $\alpha^{135}$ in the Galois field created by the primitive element $\beta^{127}$ with poly 6. As shown in FIGS. 6A and 6H, the outputs r[0] and r[7] are respectively connected directly to the inputs a[6] and a[5] of the multiplier. Each of the outputs r[1], r[5] and r[6] respectively represented in FIGS. 6B, 6F and 6G is provided by a single XOR gate. Each of the outputs r[2] and r[4] respectively shown in FIGS. 6C and 6E are formed by a pair of XOR gates. The output r[3] in FIG. 6D is provided by three XOR gates. Thus, this unary multiplier comprises ten XOR gates.

The unary multiplier for $\alpha^{135}$ with the primitive element $\beta^{106}$ with poly 15 is shown in FIGS. 7A-7H. This unary multiplier uses a single XOR gate for forming the output r[2], two XOR gates for each of the outputs r[0], r[1] and r[5], three XOR gates for each of the outputs r[6] and r[7], five XOR gates for the output r[3] and six XOR gates for the output r[6]. Totally, 24 XOR gates are required.

Another example shown in FIGS. 8-10 represents the unary multiplier $\alpha^{40}$ used, for example, in the CRC encoder/decoder of FIG. 2. In accordance with the preferred embodiments of the present invention, FIGS. 8A-8H represent this multiplier for poly 5 with primitive element $\beta^{128}$ FIGS. 9A-9H show this unary multiplier for poly 6 with primitive element $\beta^{127}$, and FIGS. 10A-10H illustrate this unary multiplier for poly 15 with primitive element $\beta^{106}$.

For comparison, FIGS. 11 and 12 show the unary multipliers $\alpha^{135}$ and $\alpha^{40}$ for poly 15 with primitive element $\beta^{88}$.

The error correcting system using primitive element $\beta^{88}$ and poly 15 requires 764 XOR gates. For $\beta^{106}$, 743 XOR gates are required. By selecting one of the primitive elements $\beta^{127}$, poly 6 or $\beta^{128}$, poly 5 the number of XOR gates in the error correcting system can be reduced to 703 XOR gates.

The number of the XOR gates is a determining factor for the total signal delay of the error correction circuit. Reduction of the signal delay allows to increase the processing speed of the error correction circuit.

There accordingly has been described a system for correcting errors that occur during data storage on optical disks. The system uses a plurality of unary multipliers for multiplying by Galois field elements $\alpha^i$, which can be generated from the same generator polynomial p(x) using various primitive elements $\beta^j$. The processing speed of the system can be increased by using fewer signal paths in the unary multipliers.

In this disclosure, there is shown and described only the preferred embodiment of the invention, but it is to be understood that the invention is capable of changes and modifications within the scope of the inventive concept as expressed herein.

I claim:

1. An apparatus for detecting errors in an optical disk memory means comprising:

Cyclic Redundancy Check (CRC) encoding means responsive to an input data supplied to said optical disk memory means for generating CRC code words added to the input data, Reed-Solomon (RS) encoding means responsive to the input data for generating RS code words to be supplied to said optical disk memory means, syndrome generating means responsive to the RS code words generated by said RS encoding means and supplied from said optical disk memory means for detecting errors in data read from said optical disk memory means, and CRC decoding means responsive to the CRC code words for checking parity errors in the read data, each of said CRC encoding means, RS encoding means, syndrome generating means and CRC decoding means including a plurality of unary multipliers for multiplying by elements of a Galois field $GF(2^n)$ generated using a primitive element $\beta^j$, each of said unary multipliers consisting of a number of Exclusive-OR (XOR) gates defined by a primitive element $\beta^j$ predetermined to reduce a total number of said XOR gates in said apparatus for detecting errors.

2. The apparatus of claim 1, wherein said unary multipliers multiply by elements of Galois field $GF(2^8)$ and said predetermined primitive element is $\beta^{106}$.

3. The apparatus of claim 2, wherein generator polynomial $p(x) = 1 + x^2 + x^3 + x^5 + x^8$ is used for generating said Galois field.

4. The apparatus of claim 1, wherein said unary multipliers multiply by elements of Galois field $GF(2^8)$ and said predetermined primitive element is $\beta^{127}$.

5. The apparatus of claim 4, wherein generator polynomial $p(x) = 1 + x^2 + x^3 + x^7 + x^8$ is used for generating said Galois field.

6. The apparatus of claim 1, wherein said unary multipliers multiply by elements of Galois field $GF(2^8)$ and said predetermined primitive element is $\beta^{128}$.

7. The apparatus of claim 6, wherein generator polynomial $p(x) = 1 + x^4 + x^5 + x^6 + x^8$ is used for generating said Galois field.

8. An apparatus for detecting errors in an optical disk memory means comprising:

Cyclic Redundancy Check (CRC) encoding means responsive to an input data supplied to said optical disk memory means for generating CRC code words added to the input data, Reed-Solomon (RS) encoding means responsive to the input data for generating RS code words to be supplied to said optical disk memory means, syndrome generating means responsive to the RS code words generated by said RS encoding means and supplied from said optical disk memory means for detecting errors in data read from said optical disk memory means, CRC decoding means responsive to the CRC code words for checking parity errors in the read data, each of said CRC encoding means, RS encoding means, syndrome generating means and CRC decoding means including a plurality of means for performing operations under elements $\alpha^i$ of a Galois field $GF(2^8)$ generated using a primitive element $\beta^j$, and each of said means for performing operations consisting of a number of Exclusive-OR (XOR) gates defined by a primitive element $\beta^j$ predetermined to reduce a total number of said XOR gates in said apparatus for detecting errors.

9. The apparatus of claim 8, wherein each of said CRC encoding and decoding means includes said means for performing operations under elements $\alpha^{10}$, $\alpha^{40}$, $\alpha^{217}$, and $\alpha^{237}$.

10. The apparatus of claim 8, wherein said RS encoding means includes said means for performing operations under elements $\alpha^{15}$, $\alpha^{70}$, $\alpha^{87}$, $\alpha^{135}$, $\alpha^{138}$, $\alpha^{154}$, $\alpha^{166}$, and $\alpha^{241}$.

11. The apparatus of claim 8, wherein said syndrome generating means includes said means for performing operations under elements $\alpha^{120}$ to $\alpha^{135}$.

12. The apparatus of claim 8, wherein said means for performing operations comprises a unary multiplier.

13. The apparatus of claim 8, wherein said predetermined primitive element is $\beta^{106}$.

14. The apparatus of claim 13, wherein generator polynomial $p(x) = 1 + x^2 + x^3 + x^5 + x^8$ is used for generating said Galois field.

15. The apparatus of claim 8, wherein said predetermined primitive element is $\beta^{127}$.

16. The apparatus of claim 15, wherein generator polynomial $p(x) = 1 + x^2 + x^3 + x^7 + x^8$ is used for generating said Galois field.

17. The apparatus of claim 8, wherein said predetermined primitive element is $\beta^{128}$.

18. The apparatus of claim 17, wherein generator polynomial $p(x) = 1 + x + x^5 + x^6 + x^8$ is used for generating said Galois field.

19. An apparatus for detecting errors in an optical disk memory having an input for receiving input data comprising:

Cyclic Redundancy Check (CRC) encoder coupled to said input of said optical disk memory for generating CRC code words added to the input data, Reed-Solomon (RS) encoder coupled to said CRC encoder for generating RS code words to be supplied to said optical disk memory, syndrome generating circuit coupled to said optical disk memory to receive the RS code words for detecting errors in data read from said optical disk memory, CRC decoder coupled to said optical disk memory to receive the CRC code words unloaded from said optical disk memory for checking parity errors in the read data, each of said CRC encoder, RS encoder, syndrome generating circuit and CRC decoder including a plurality of unary multipliers for multiplying by elements $\alpha^i$ of a Galois field $GF(2^n)$, generated using a generator polynomial p(x) and a primitive element $\beta^j$, each of said unary multipliers consisting of Exclusive-OR (XOR) gates, said primitive element $\beta^j$ being preselected to reduce a total number of said XOR gates in said CRC encoder, RS encoder, syndrome generating circuit and CRC decoder.

20. The apparatus of claim 19, wherein each of said CRC encoder and decoder includes said unary multipliers for multiplying by elements $\alpha^{10}$, $\alpha^{40}$, $\alpha^{217}$, and $\alpha^{237}$.

21. The apparatus of claim 19, wherein said RS encoding means includes said unary multipliers for multiplying by elements $\alpha^{15}$, $\alpha^{70}$, $\alpha^{87}$, $\alpha^{135}$, $\alpha^{138}$, $\alpha^{154}$, $\alpha^{166}$, and $\alpha^{241}$.

22. The apparatus of claim 19, wherein said syndrome generating circuit includes said unary multipliers for multiplying by elements $\alpha^{120}$ to $\alpha^{135}$.

23. The apparatus of claim 19, wherein said preselected primitive element is $\beta^{106}$.

24. The apparatus of claim 23, wherein said generator polynomial is $p(x) = 1 + x^2 + x^3 + x^5 + x^8$.

25. The apparatus of claim 19, wherein said preselected primitive element is $\beta^{127}$.

26. The apparatus of claim 25, wherein said generator polynomial is $p(x) = 1 + x^2 + x^3 + x^7 + x^8$.

27. The apparatus of claim 19, wherein said preselected primitive element is $\beta^{128}$.

28. The apparatus of claim 19, wherein said generator polynomial is $p(x) = 1 + x + x^5 + x^6 + x^8$.

* * * * *